(12) United States Patent
Pettersson et al.

(10) Patent No.: US 7,740,909 B2
(45) Date of Patent: Jun. 22, 2010

(54) METHOD OF RATIONAL LARGE VOLUME CVD PRODUCTION

(75) Inventors: Lena Pettersson, Vattholma (SE); Johnny Bergstedt, Fagersta (SE); Edward Laitila, Fagersta (SE); Bo Danielsen, Fagersta (SE); Björn Lifvergren, Fagersta (SE)

(73) Assignee: Seco Tools AB, Fagersta (SE)

( * ) Notice: Subject to any disclaimer, the term of this patent is extended or adjusted under 35 U.S.C. 154(b) by 681 days.

(21) Appl. No.: 11/633,476

(22) Filed: Dec. 5, 2006

(65) Prior Publication Data

US 2007/0111618 A1    May 17, 2007

Related U.S. Application Data

(62) Division of application No. 10/880,447, filed on Jul. 1, 2004, now abandoned.

(30) Foreign Application Priority Data

Jul. 10, 2003    (SE) .................................. 0302056-7

(51) Int. Cl.
*C23C 16/30*    (2006.01)

(52) U.S. Cl. ............... 427/249.1; 427/249.19; 427/255.394; 427/427

(58) Field of Classification Search ...... 442/6, 442/8, 13; 427/248.1, 421.1, 427, 249.1, 427/249.19, 255.394
See application file for complete search history.

(56) References Cited

U.S. PATENT DOCUMENTS

| 4,619,866 | A | | 10/1986 | Smith et al. | |
|---|---|---|---|---|---|
| 5,576,058 | A | * | 11/1996 | Norrgrann et al. | 427/248.1 |
| 5,674,564 | A | * | 10/1997 | Ljungberg et al. | 427/255.34 |
| 5,759,621 | A | * | 6/1998 | Norrgrann et al. | 427/248.1 |
| 6,166,432 | A | * | 12/2000 | Ohno et al. | 257/701 |
| 6,231,969 | B1 | * | 5/2001 | Knight et al. | 428/332 |
| 6,391,394 | B1 | * | 5/2002 | Shirasuna et al. | 427/569 |
| 6,544,599 | B1 | * | 4/2003 | Brown et al. | 427/475 |
| 6,562,111 | B2 | * | 5/2003 | Edlund et al. | 96/4 |
| 7,211,292 | B1 | * | 5/2007 | Budaragin | 427/227 |
| 2003/0143384 | A1 | * | 7/2003 | Ruppi et al. | 428/210 |
| 2005/0132957 | A1 | * | 6/2005 | El-Raghy et al. | 118/500 |

FOREIGN PATENT DOCUMENTS

| EP | 0 424 620 | | 5/1991 |
|---|---|---|---|
| JP | 06-007875 | | 1/1994 |
| JP | 6-7875 | * | 1/1994 |
| SE | 9400950 | | 9/1995 |
| WO | 90/08613 | | 8/1990 |

* cited by examiner

*Primary Examiner*—Bret Chen
(74) *Attorney, Agent, or Firm*—Drinker Biddle & Reath LLP

(57) ABSTRACT

The present invention relates to a method to rationally coat cutting tool inserts comprising a substrate and a coating deposited using a CVD and/or MTCVD method. According to the invention the inserts are positioned on a net with a surface roughness, $R_a$, of the wires between 2 and 50 μm.

7 Claims, 3 Drawing Sheets

METHOD OF RATIONAL LARGE VOLUME CVD PRODUCTION

This is a divisional application of application Ser. No. 10/880,447, now abandoned, filed on Jul. 1, 2004, which is incorporated by reference herein in its entirety, which claims priority to Swedish application no 0302056-7 filed on Jul. 10, 2003, which is incorporated by reference herein in its entirety.

The present invention relates to a method of coating large volumes of cutting tools (indexable inserts) for machining by chip removal in a rational and productive manner, which inserts contain hard and wear resistant refractory layers deposited by CVD (Chemical Vapor Deposition) and/or MTCVD (Moderate Temperature Chemical Vapor Deposition). The method is based on the use of a woven metal net with a certain surface roughness. In this way, it has been found possible to reduce the drawbacks of the prior art methods.

CVD-deposited wear resistant coatings, particularly of TiC, Ti(C,N), TiN and $Al_2O_3$ on cemented carbide inserts have been industrially produced since the beginning of the 1970's. Details regarding the deposition condition of CVD and/or MTCVD coatings and the design of CVD and/or MTCVD based coatings have been extensively discussed in the literature as well as in patents.

One of the major advantages of the CVD and/or MTCVD technique is the possibility of coating very large numbers of tools in the same batch, up to 30,000 inserts depending on the size, which gives a low production cost per insert with a coating all-around the insert. In order to obtain a uniform coating thickness distribution, it is important that functional surfaces of the inserts are relatively equally separated during the coating operation. However, during the coating operation not only the tools are coated but also the support on which the tool rests resulting in that the insert grows together with the surfaces of the support. When the inserts are removed after the coating cycle is finished, contact marks appear at those spots.

These contact marks are not only a cosmetic problem. If they appear on surfaces actually in operation during the metal cutting operation, they may lead to a decreased tool life. In addition, the support surfaces on an insert must be flat, without protruding marks, in order to avoid erroneous positioning of the insert in the tool holder. An erroneously positioned insert will negatively influence the performance of the cutting tool, i.e., decreased toughness and changed accuracy and surface finish of the work piece. In order to minimize the negative effect of the contact marks, several complicated arrangements have been reported where objective is to move the marks from the functional surfaces to other areas.

Another important aspect on such a system for batch loading of CVD and/or MTCVD coated inserts is that it has to be very flexible to compensate for the difference in insert style. A typical standard CVD and/or MTCVD coating is deposited onto inserts of different size varying from 5 mm in inscribed circle up to 50 mm. The shape of the insert varies, e.g., rectangular, octohedrical, square, round, triangle, diamond, etc. The insert can be with or without a central hole and with different thickness varying from 2 mm up to 10 mm. One type of a CVD and/or MTCVD coating cycle will therefore be deposited onto as much as hundreds of different styles of inserts all needing different arrangements. Therefore, a batch loading system which necessarily needs different arrangement for different insert styles in order to get a uniform loading density will never work very rationally in a production environment focused on low cost and short lead time.

EP 454,686 discloses a loading system, particularly aimed for PACVD, where in the inserts are stacked on top of each other on a central pin with or without a spacer between. Using this method for CVD and/or MTCVD yields several disadvantages as it is not a universal method, as described above, since different styles of inserts will need different set-up of the pins. Secondly, a hole is needed on the inserts. Third, when applying thick CVD and/or MTCVD coating the inserts will probably heavily get stuck to the spacer and/or other inserts due to the pressure from the above position inserts which will enhance the tendency to grow together.

U.S. Pat. No. 5,576,058, U.S. Pat. No. 5,759,621 and SE 940,0950 disclose a batch loading system based on different arrangement of pegs comprising a foot portion, a shoulder portion, a neck and a head. This batch loading system will never be very flexible or rational as described above since different styles of inserts will need different set-up of pegs.

A commonly used loading arrangement is to place the inserts into holes or slits in a tray. This method will give contact marks on the cutting edge or on clearance faces of the inserts. Using this arrangement needs also a very careful handling during transportation and loading of the trays in order to avoid that the inserts fall out of their positions. This arrangement is also very difficult to use when automated insert setting is used since the inserts shall be put in very unstable positions.

In yet another method, the inserts are threaded up on a rod. The rods may be vertically arranged as in EP 454,686 with the same disadvantages as discussed above, or horizontally. The main drawback of the horizontally arrangement is the lack of universality for different insert styles, which is why necessarily a large number of different set-ups are needed in order to produce all styles of inserts. Additionally, this method can only be applied to inserts with a hole.

The most universal arrangements are based on simply placing the inserts on a surface separated with necessary spacing in-between either on woven metal nets or on some other surface (often made of graphite). The load is built up by piling each metal net on top of each other separated by some distance or using some graphite carrier onto which the nets are positioned. The great drawback with this method so far has been contact marks between the nets and the inserts that always are formed. These marks give an incorrect positioning of the insert in the tool holder and may give seriously decreased performance of the inserts. Often, some post-treatment may be needed in order to remove protruding marks. Also marks may be found on the cutting edge which also is very negative for insert performance. Another disadvantage with using woven nets is that inserts relatively easily may slide together before deposition thereby resulting in uncoated areas on the inserts.

OBJECTS AND SUMMARY OF THE INVENTION

It is an object of this invention to provide a CVD and/or MTCVD batch loading system which allows a rational production method without a large number of different arrangements depending on different insert styles i.e., a universal, insert style independent system.

It is further an object of this invention to provide a CVD and/or MTCVD batch loading system which avoids the problems of the prior art batch loading systems based on woven metal nets, i.e., contact marks and/or that inserts slide together prior to or during deposition.

In one embodiment of the invention there is provided in a method to rationally coat cutting tool inserts comprising depositing a coating on a substrate using a CVD and/or MTCVD method, the improvement comprising positioning the inserts on a wire net with a surface roughness, $R_a$, of the wires of between 2 and 50 μm.

In another embodiment of the invention, there is provided a woven metal net wherein the surface roughness, $R_a$, of the wires is between 2 and 50 μm.

BRIEF DESCRIPTION OF THE DRAWING FIGURES

DETAILED DESCRIPTION OF THE INVENTION

Figure 1:
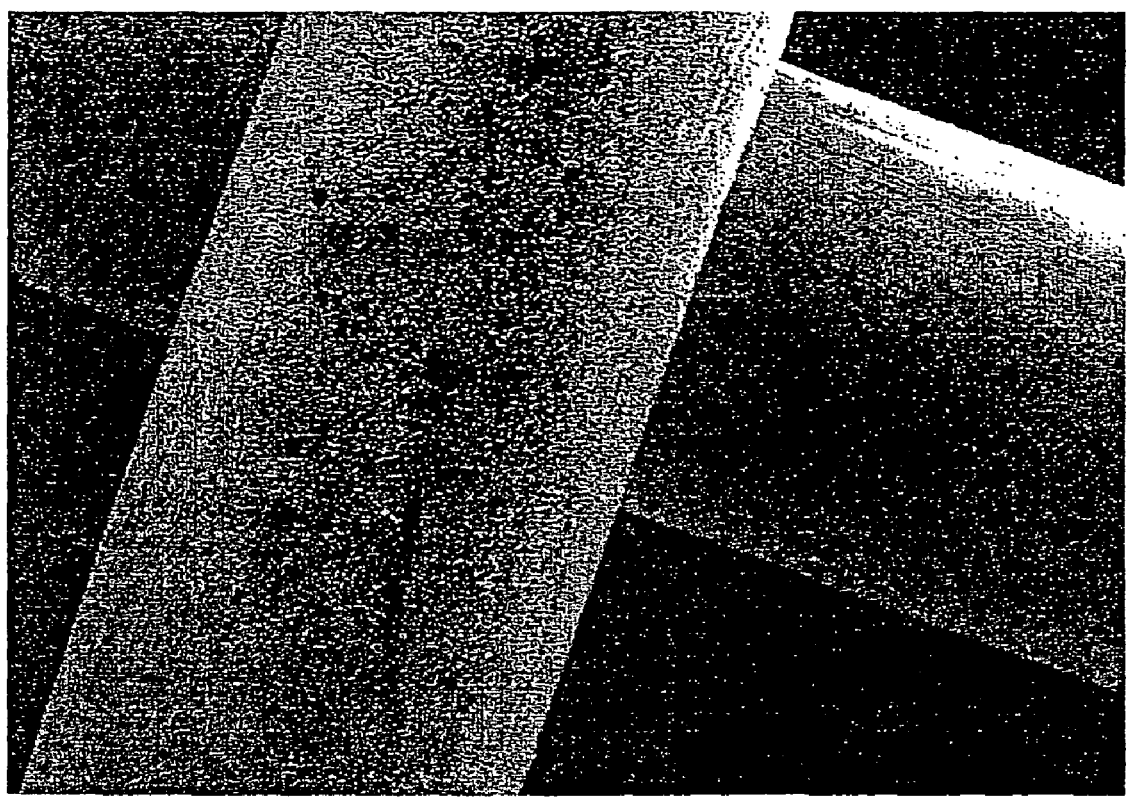
FIG. 1 is a SEM (Scanning Electron Microscope) image of a Mo-wire from a net pre-coated with approximately 5 μm CVD and MTCVD coating of Ti(C,N)+Al$_2$O$_3$+TiN.

In the following description we will use terms as follows: Spray-coating(s) define(s) a coating preferably applied by a spray process as thermal spraying, plasma spraying etc. Pre-coating(s) define(s) a CVD and/or MTCVD-coating applied onto the net or support material before first time use in the deposition of wear resistant CVD and/or MTCVD coatings onto the final product, herein defined as production-coating(s).

The critical size of the protruding marks, where they start to influence the properties of the tool, used in the following description as the limit for approval or rejection of an insert is a maximum height of 20 μm.

According to the present invention, it has surprisingly been found that if the surface of a woven metal net is provided with a certain surface roughness, it is possible to avoid large contact marks and in particular to avoid protruding marks. This optimal surface structure essentially eliminates the problems of the prior art.

According to present invention, the surface roughness, $R_a$, of the net is between 2 and 50 μm, preferably between 3 and 20 μm.

The woven metal nets may be made of metals as Fe, Ni, Mo, Cr, Ta, Ti, W or alloys thereof. Also other materials from which a net is possible to produce could be used provided that they have a sufficient strength at 1000° C. Preferably, the woven nets are made of Fe, Mo or alloys thereof. The nets shall have a mesh size, defined as the number of equally spaced openings per linear inch, which allow a uniform gas flow, and an optimal wire diameter to get sufficient strength and optimal number of contact marks. The mesh size of the unused net is preferably between about 5 and 12. The wire diameter is preferably between about 0.3 mm and 1.2 mm.

In a preferred embodiment, a surface with the desired surface roughness is obtained by depositing a coating thereon using spray-coating deposited by the use of plasma spraying, thermal spraying and other similar techniques. The spray-coating process could be of either warm or cold type.

The spray-coating(s) may be deposited onto both sides of the net, but it is necessary only on the side aimed to be in contact with the inserts.

The sprayed coating(s) comprise(s) metals such as Fe, Ni, Mo, Cr, Ta, Ti, W or alloys thereof. Also, other materials like oxides, carbides and nitrides are possible and/or composites between metal(s) and or ceramic(s). Preferably, the spray-coating is made of Fe, Mo or alloys based on those metals. In order to obtain a good adhesion between the net, or support material to the spray-coating, it is an advantage if the ratio, k, between the coefficients of thermal expansion of the net (or support) material, $\alpha_n$, and the spray-coating, $\alpha_s$, is between 0.5 and 1.5.

Prior to deposition of the spray-coating, it is important that the net is properly cleaned. Pre-treatment of the uncoated nets involving mechanical cleaning as dry and/or wet blasting could also offer advantage by enhancing the adhesion of the coatings.

The spray-coating(s) layer can be deposited directly onto the metal net as a single layer or as multilayer consisting of different materials mentioned above. Also, a first intermediate CVD and/or MTCVD coating based on TiC and/or Ti(C,N) and/or Al$_2$O$_3$ layer(s) could be deposited onto the metal net before any spray-coating(s) are deposited.

Figure 3:
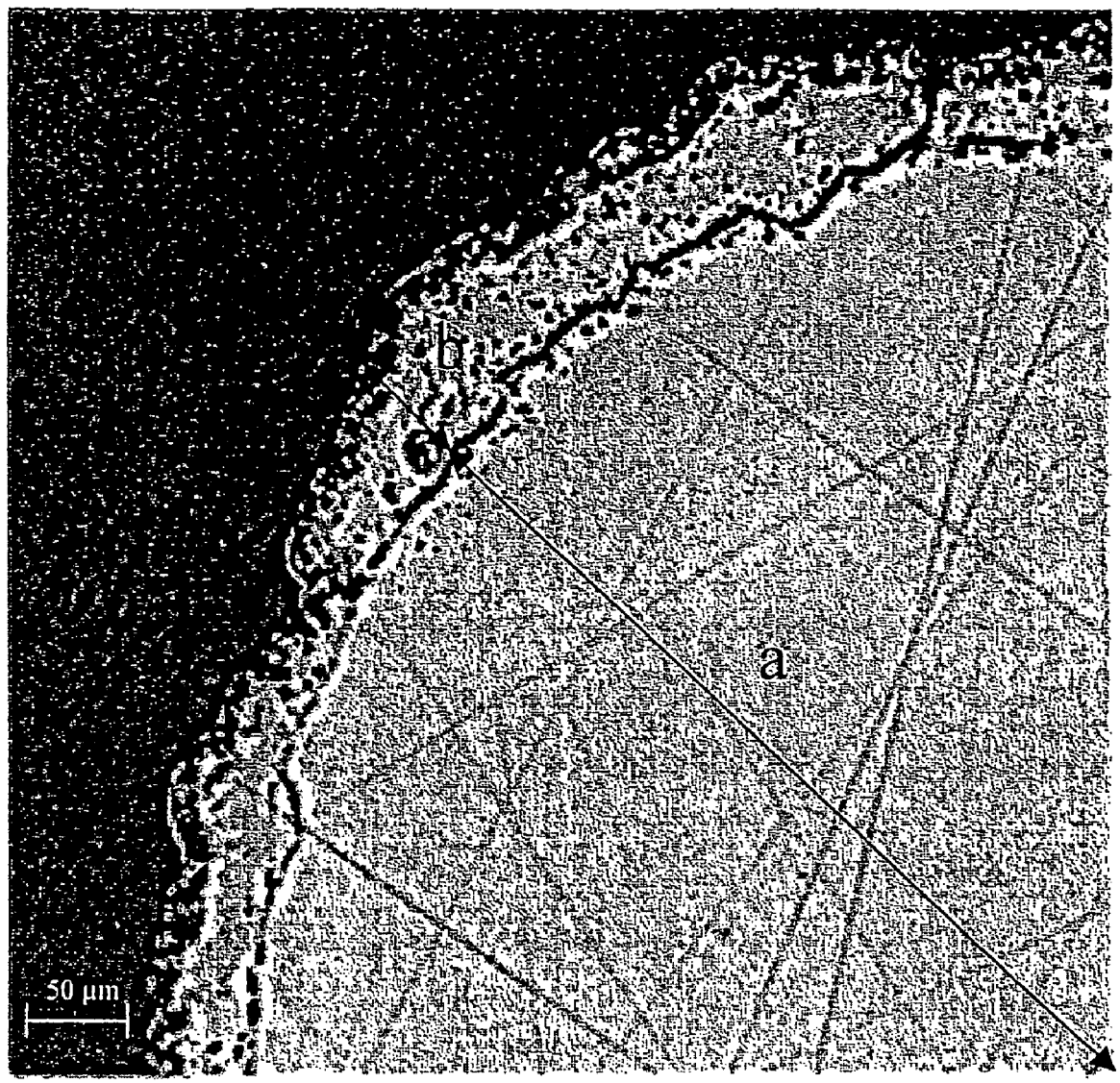
FIG. 3 is a LOM (Light Optical Microscope) image of a cross section of a Mo-net with radius, measure a, that has been spray-coated with a Mo-layer, which thickness is defined by the measure b.

The total average coating thickness of said spray-coating(s), on the side in contact with the inserts is between 5 and 300 μm, preferably between 25 and 200 μm. FIG. 3 shows a LOM polished part of a cross section of a Mo-net with radius of 450 μm (the measure a) which is spray-coated with 50 μm thick Mo-layer (the measure b) according to present invention. This figure clearly shows the unevenness of the spray-coating which offers the advantage of smaller contact points between the insert and the net which in turn results in smaller and less protruding contact marks. It can also be seen in the figure the difficulties in discussing and/or specifying the exact coating thickness of the spray-coating(s) due to unevenness while only some rough average value can be given.

Table 1 shows the influence on the surface roughness from the usage of the nets. Using an optical interference measurement device, measurements of the surface roughness were made. The Mo-wire pre-coated with a CVD and MTCVD coating of Ti(C,N)+Al$_2$O$_3$+TiN of a total thickness of 5 μm, variant a, resulting is a surface roughness $R_a$ of 0.3 μm. Variant c in table 1 is a Mo-wire coated with a sprayed Mo-coating of thickness 50 μm and pre-coated with a CVD AND MTCVD coating of Ti(C,N)+Al$_2$O$_3$+TiN of a total thickness of 5 μm giving, the spray-coating process changed the surface roughness $R_a$ to a value of 11 μm. The variants b and d in table 1 correspond to variant a and c but after additionally four production coating cycles of all together approximately 25 μm CVD Ti(C,N)+TiC+TiN coating resulting in a surface roughness of 0.4 μm and 8.9 μm, respectively. It is worth noting that the surface roughness has stayed rather unaffected for the spray-coated net as well as for the unspray-coated net during usage, but at different levels of surface roughness.

TABLE 1

| Net variant | $R_a$, arithmetic mean value (μm) | $R_t$, maximum profile depth, top to bottom (μm) | $R_p$, maximum profile height, top to median line (μm) |
|---|---|---|---|
| a, (Mo-net, pre-coated) | 0.3 | 2.9 | 1.4 |
| b, (Mo-net, pre-coated, production-coated four time) | 0.4 | 3.8 | 1.7 |
| c, (Spray coated Mo-net, pre-coated) | 11 | 51 | 31 |
| d, (Spray coated Mo-net, pre-coated, production-coated four times | 8.9 | 39 | 24 |

Before use for production-coating, the spray-coated net is preferably pre-coated with a CVD and/or MTCVD coating based on TiC and/or Ti(C,N) and/or $Al_2O_3$ and/or TiN, single or multi-layers, of a total coating thickness between 2 and 150 µm, preferably between 5 and 50 µm.

Post annealing, or intermediate annealing, in an inert or reactive atmosphere of the spray-coated nets could also be used in order to increase the performance by enhancing the coating adhesion.

The desired surface structure could also be produced using other coating technologies.

In another embodiment, the desired surface roughness is obtained by etching of the nets in a suitable medium. This method is in particular applicable to nets made of a multiphase material such as some stainless steels.

In yet another embodiment, the desired surface roughness is obtained by mechanical methods such as blasting.

The present invention has been described with reference to inserts but it is obvious that it also would be beneficial for the processing of other types of coated components, e.g., drills, end-mills, wear parts, etc.

In another embodiment, the woven metal net to be spray-coated is exchanged to material with an optimized-designed surface, i.e., metal sheet with a pattern of pressed holes and protruding tips.

The invention is additionally illustrated in connection with the following Examples, which are to be considered as illustrative of the present invention. It should be understood, however, that the invention is not limited to the specific details of the Examples.

Example 1

A woven Mo-net with a wire diameter of 0.9 mm and a mesh size of 7 was pre-coated with a CVD and MTCVD coating of Ti(C,N)+$Al_2O_3$+TiN of a total thickness of 5 µm. The wires had a surface roughness $R_a$ of 0.3 µm, see FIG. 1 and Table 1 variant a, here designed variant A.

Figure 2:
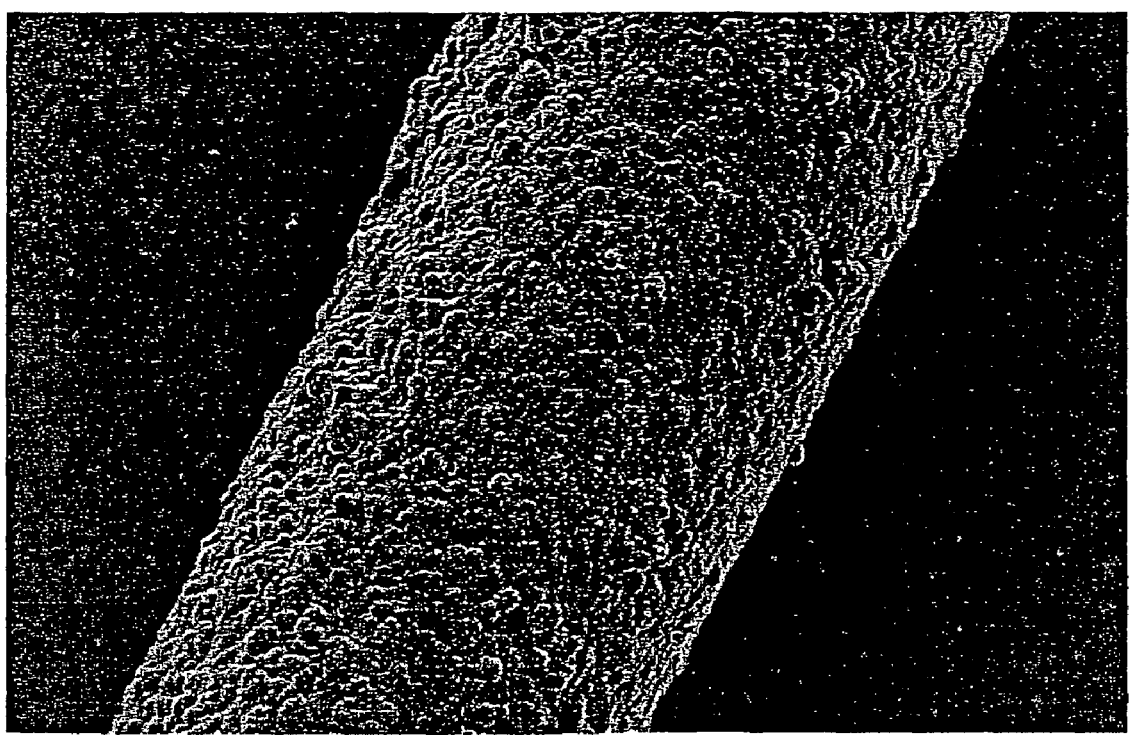
FIG. 2 is a SEM image of a Mo-wire from a net which prior to first time use has been spray-coated with approximately 50 μm thick Mo-layer and subsequently pre-coated with approximately 5 μm CVD and MTCVD coating of Ti(C,N)+Al$_2$O$_3$+TiN according to the present invention.

The same type of net as used for variant A, was coated with an approximately 50 µm thick spray-coating of Mo onto the Mo-net prior to first time use. The net was thereafter pre-coated with a CVD and MTCVD coating of Ti(C,N)+$Al_2O_3$+TiN of a total thickness of 5 µm. The surface roughness, $R_a$, was 11 µm, see FIG. 2 and Table 1 variant c, here designed variant B.

Cemented carbide inserts of style XOMX0908-ME06 with composition 91 wt % WC-9 wt % Co were used. Before deposition the uncoated substrates were cleaned. A CVD production-coating of Ti(C,N)+TiC+TiN with an approximately 5 µm total coating thickness was deposited on the inserts. Totally ten nets per variant were used and onto each of the woven Mo-nets 330 inserts were positioned. After production-coating, 5% of randomly picked inserts from each net were checked for contact marks. If the marks were of protruding type, the maximum height of the protrusions was measured with an optical Nikon device. If more than one protruding mark on one insert were found the maximum height was taken as the measure of the actual insert. Depending on the height of the protruding mark the inserts were classified into four different classes;

Class 1: No marks
Class 2: Marks<10 µm
Class 3: 10 µm<Marks<20 µm
Class 4: Marks>20 µm, Not approved.

Inserts measured were coated in first production-coating cycle after pre-coating. Table 2 below summarizes the results.

TABLE 2

|  | Variant A | Variant B |
|---|---|---|
| Mean (µm) | 20 | 7 |
| Standard deviation (µm) | 4 | 6 |
| Minimum (µm) | 10 | 0 |
| Maximum (µm) | 28 | 19 |
| Class 1 (%) | 0.0 | 23.8 |
| Class 2 (%) | 1.9 | 45.6 |
| Class 3 (%) | 56.2 | 30.6 |
| Class 4 (%) (Not approved) | 41.9 | 0.0 |

It can clearly be seen that variant B got much less and smaller marks. By using the present invention all inserts are approved, i.e., protruding marks smaller than 20 µm, while using prior art 42% are not approved.

Example 2

The same nets as in example 1 were tested using the same analyzing and classifying method but after additionally three production-coating cycle (totally production coated four times). Variant C corresponding to variant A (in example 1) but used for a longer time has still a low surface roughness $R_a$ of 0.4 µm, see Table 1 variant b. In the same way corresponds variant D, with a surface roughness $R_a$ of 8.9 µm to variant B (in example 1), see Table 1 variant d. The inserts measured and classified were coated in production-coating cycle number five after pre-coating. All production-coating cycles were of same type as in example 1. The total production-coating thickness is approximately 25 µm. Table 3 below summarizes the results.

TABLE 3

|  | Variant C | Variant D |
|---|---|---|
| Mean (µm) | 17 | 8 |
| Standard deviation (µm) | 9 | 3 |
| Minimum (µm) | 5 | 0 |
| Maximum (µm) | 52 | 17 |
| Class 1 (%) | 0.0 | 0.9 |
| Class 2 (%) | 24.4 | 78.9 |
| Class 3 (%) | 47.9 | 20.2 |
| Class 4 (%) | 27.7 | 0 |

The variant C, which is according to prior art, works somewhat better than in example 1 but still 28% are not approved. By using the present invention all inserts are approved.

Example 3

The same variants of nets as in example 1 were tested using the same analyzing and classifying method. A thicker CVD coating, total coating thickness of 8 µm, including a 3 µm thick $Al_2O_3$ layer, was grown onto the substrates. The insert style was CNMG120412-MF2. Inserts measured were coated in production-coating cycle number five after pre-coating. The surface roughness, $R_a$, prior to this production-coating is estimated to be rather similar as in example 2, i.e., approximately 9 µm and 0.5 µm, respectively. Table 4 below summarizes the results.

TABLE 4

|  | Variant E | Variant F |
| --- | --- | --- |
| Mean (μm) | 17 | 9 |
| Standard deviation (μm) | 4 | 3 |
| Minimum (μm) | 6 | 0 |
| Maximum (μm) | 30 | 17 |
| Class 1 (%) | 0.0 | 1.9 |
| Class 2 (%) | 6.9 | 65.0 |
| Class 3 (%) | 75.6 | 33.1 |
| Class 4 (%) Not approved | 17.5 | 0.0 |

It can clearly be seen that the spray-coated variant F got much less and smaller marks. Also in this example by using the present invention all inserts are approved, while using prior art 18% are not approved.

The principles, preferred embodiments, and modes of operation of the present invention have been described in the foregoing specification. The invention, which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. In a method to rationally coat cutting tool inserts comprising depositing a coating on a substrate using a CVD and/or MTCVD method, the improvement comprising positioning the inserts directly on a wire net with a surface roughness, $R_a$, of the wires of between 2 and 50 um, wherein the spray-coated net has been pre-coated with an intermediate CVD and/or MTCVD coating based on one or more of TiC, Ti(C,N), TiN, and $Al_2O_3$ of a total thickness between 2 and 50 um.

2. In the method of claim 1 wherein the surface roughness, $R_a$, of the wires is between 3 and 20 μm.

3. In the method of claim 2 wherein the surface roughness is obtained by etching and/or mechanical treatment.

4. In the method of claim 1 wherein the net material is made of Fe, Ni, Mo, Cr, Ta, Ti, W or alloys based thereof.

5. In the method according to claim 4 wherein the net material is Fe, Mo or alloys based thereof.

6. In the method of claim 1 wherein the spray-coating material is Fe, Ni, Mo, Cr, Ta, Ti, W or alloys based thereof.

7. In the method of claim 6 wherein the spray-coating material is Fe, Mo or alloys based thereof.

* * * * *